(12) United States Patent
Attridge et al.

(10) Patent No.: US 8,398,869 B2
(45) Date of Patent: Mar. 19, 2013

(54) TRANSFER FILM AND METHOD FOR FABRICATING A CIRCUIT

(75) Inventors: Paul Attridge, Colchester, CT (US); Foster P. Lamm, South Windsor, CT (US)

(73) Assignee: Sikorsky Aircraft Corporation, Stratford, CT (US)

( * ) Notice: Subject to any disclaimer, the term of this patent is extended or adjusted under 35 U.S.C. 154(b) by 1133 days.

(21) Appl. No.: 12/277,391

(22) Filed: Nov. 25, 2008

(65) Prior Publication Data

US 2010/0126958 A1    May 27, 2010

(51) Int. Cl.
*H01B 13/00* (2006.01)
*C23F 1/02* (2006.01)
(52) U.S. Cl. ............................. 216/20; 216/17
(58) Field of Classification Search ............ 216/20, 216/17
See application file for complete search history.

(56) References Cited

U.S. PATENT DOCUMENTS

| | | | | |
|---|---|---|---|---|
| 3,948,701 | A | * | 4/1976 | Fasbender et al. .............. 216/17 |
| 4,927,491 | A | * | 5/1990 | Masaki ............................ 216/18 |
| 5,104,707 | A | * | 4/1992 | Watanabe et al. ............ 428/40.9 |
| 6,136,127 | A | | 10/2000 | DeBastiani |
| 6,280,851 | B1 | * | 8/2001 | Pasternack et al. ........... 428/447 |
| 7,391,622 | B2 | | 6/2008 | Marshall et al. |
| 2002/0063317 | A1 | * | 5/2002 | Hashimoto .................... 257/678 |
| 2005/0276934 | A1 | * | 12/2005 | Fukui et al. ................... 428/32.6 |
| 2007/0218378 | A1 | * | 9/2007 | Drews et al. ................. 430/58.8 |
| 2008/0241361 | A1 | * | 10/2008 | Jo et al. ........................ 427/98.8 |

* cited by examiner

*Primary Examiner* — Duy Deo
*Assistant Examiner* — Mahmoud Dahimene
(74) *Attorney, Agent, or Firm* — Carlson, Gaskey & Olds PC

(57) ABSTRACT

A method of fabricating a circuit includes bonding an electrically conductive layer to a carrier film using an adhesive selected from acrylic polymer and silicone polymer, removing selected portions of the electrically conductive layer from the carrier film to provide a circuit arrangement, and transferring the circuit arrangement from the carrier film to a substrate.

18 Claims, 1 Drawing Sheet

TRANSFER FILM AND METHOD FOR FABRICATING A CIRCUIT

BACKGROUND OF THE INVENTION

This disclosure relates to electrical circuits and, more particularly, to a method and transfer film for fabricating an electrical circuit on a structure.

Printed circuit boards ("PCB's") having sensors are typically integrated into structures to monitor mechanical conditions of the structure. For example, a PCB may be incorporated into a structure by embedding the PCB in a wall of the structure or by bonding the PCB to a surface of the structure. However, incorporation of the PCB by embedding or bonding may be invasive with regard to the properties of the structure. For instance, embedding the PCB may cause a mechanical weakness in the structure. Therefore, there is a need for a less invasive circuit and method of integrating a circuit and a structure.

SUMMARY OF THE INVENTION

An example method of fabricating a circuit includes bonding an electrically conductive layer to a carrier film using an adhesive selected from acrylic polymer and silicone polymer, removing selected portions of the electrically conductive layer from the carrier film to provide a circuit arrangement, and transferring the circuit arrangement from the carrier film to a substrate.

In disclosed embodiments, the electrically conductive layer may be a metal layer that is bonded to the donor film. Additionally, at least one electrical device may also be bonded to the circuit arrangement and transferred with the circuit arrangement to the substrate.

The disclosed methods may be utilized with a transfer film for manufacturing a circuit. The transfer film includes the donor film and an etched-metal circuit arrangement removably bonded to the donor film for subsequent transfer to the substrate.

BRIEF DESCRIPTION OF THE DRAWINGS

The various features and advantages of the disclosed examples will become apparent to those skilled in the art from the following detailed description. The drawings that accompany the detailed description can be briefly described as follows.

DETAILED DESCRIPTION OF THE PREFERRED EMBODIMENT

Figure 1:
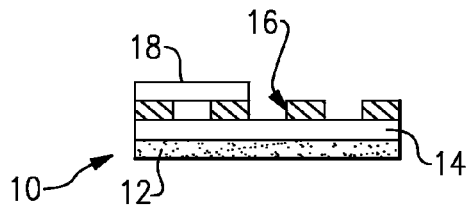
FIG. 1 illustrates an example transfer film prior to transferring a circuit arrangement of the transfer film to a substrate.

FIG. 1 illustrates selected portions of an example transfer film 10 for fabricating a circuit. As will be described herein, the transfer film 10 is constructed with a removably attached circuit arrangement 16 that can be transferred from the transfer film 10 onto a substrate 22 (FIG. 2), such as a component, product, device or other type of substrate. A disclosed method 40 may be used with the transfer film 10 to bond the circuit arrangement 16 directly onto the substrate 22 and thereby facilitate integration with negligible effects on the mechanical properties of the substrate 22.

The transfer film 10 includes a donor film 12 (i.e., a carrier film). The donor film 12 may be relatively thin and flexible, and may be fabricated from a polymeric material such as polyimide (e.g., KAPTON®). As can be appreciated, the donor film 12 may alternatively be relatively thick and rigid, or may be fabricated from another type of material that is suitable for the particular needs of an intended use.

The donor film 12 may have any desired shape that corresponds to an area of the substrate 22 onto which the circuit arrangement 16 is to be transferred. For instance, the donor film 12 may be in the form of a sheet, strip, closed plane, open plane, three-dimensional contour, or other shape.

An adhesive layer 14 on the donor film 12 removably bonds the circuit arrangement 16 to the donor film 12. The adhesive layer 14 may include any type of adhesive material that is capable of removably bonding the circuit arrangement 16 to the donor film 12. For instance, the adhesive material may be an acrylic polymer, silicone polymer, or other type of thermoplastic polymer.

The adhesive layer 14 includes an associated bonding strength. For instance, the bonding strength is suitable for non-permanently attaching the circuit arrangement 16 to the donor film 12. That is, the donor film 12 can be mechanically removed from the circuit arrangement 16 without damaging the circuit arrangement 16, as will be described below. Alternatively, the adhesive layer 14 may have a stronger bonding strength and be removed using a solvent.

The transfer film 10 optionally may also include at least one electrical device 18 bonded to the donor film 12. For instance, the transfer film 10 includes a network or array of the electrical devices 18 in electrical communication via the circuit arrangement 16. The electrical devices 18 (one shown) are bonded on the circuit arrangement 16 using solder 19. The electrical device 18 may be in a different location than shown with regard to the circuit arrangement 16 and donor film 12. Given this description, one of ordinary skill in the art will recognize suitable locations based on the needs of a particular implementation.

Figure 2:
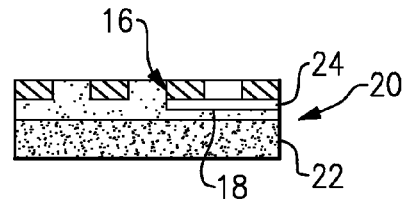
FIG. 2 illustrates an example device fabricated using the transfer film of FIG. 1.

Referring to FIG. 2, the transfer film 10 may be used to fabricate a device 20 having the substrate 22 and the circuit arrangement 16 bonded thereto. For instance, the substrate 22 may be a component, product, device or other type of substrate. Additionally, the substrate 22 may be flat or have a three-dimensional, contoured shape. In another example, the substrate 22 is an airfoil fabricated from a carbon fiber composite material.

An adhesive layer 24 effectively permanently bonds the circuit arrangement 16 to the substrate 22. For instance, the circuit arrangement 16 may not be removed from the substrate 22 without destroying or damaging the circuit arrangement 16.

The circuit arrangement 16 and electrical devices 18 may function on the device 20 as a health or maintenance condition management system for the substrate 22. For example, the electrical devices 18 may be sensors that detect a physical property that is used to monitor the condition of the substrate 22. For instance, the electrical devices 18 may be piezoelectric sensors that generate an electric current in response to a mechanical strain on the substrate 22. The circuit arrangement 16 electrically connects the electrical devices 18 to a central controller that receives the electric current. The central controller may include software, hardware, or both that utilize algorithms or other techniques to determine the condition of the substrate 22 based on the electric current. As can be appreciated, the transfer film 10 may include a variety of different types of sensors, depending on the physical properties of interest that are to be monitored.

Figure 3:
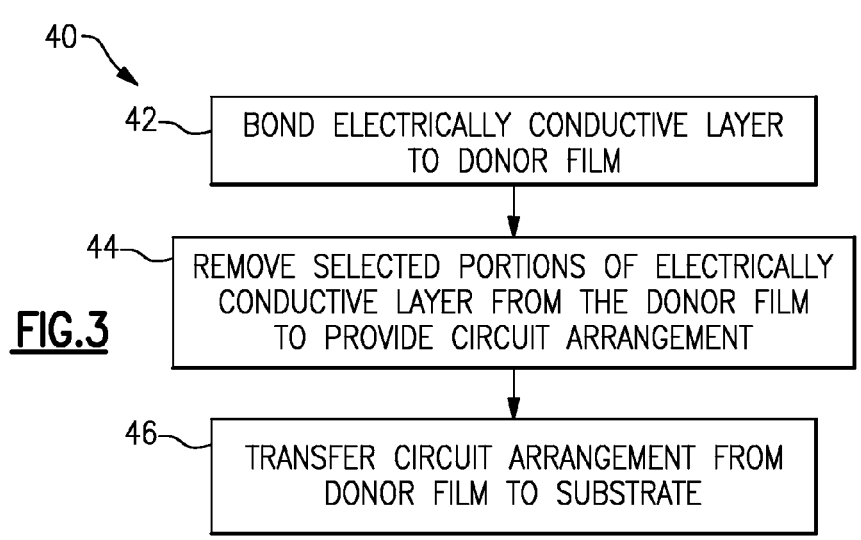
FIG. 3 illustrates an example method for using the transfer film of FIG. 1 to fabricate a circuit.

FIG. 3 illustrates an example method 40 that may be used with the transfer film 10 to fabricate a circuit such as for the device 20 of FIG. 2. The method 40 includes a bonding action 42 to bond an electrically conductive layer 50 (FIG. 4) to the donor film 12. In a removal action 44, selected portions of the electrically conductive layer 50 are removed from the donor film 12 to provide the circuit arrangement 16. In a transfer action 46, the circuit arrangement 16 is transferred from the donor film 12 to the substrate 22. As can be appreciated, the method 40 as described is not limited to the transfer film 10 or device 20 disclosed herein and may be applied to other transfer films and devices.

Figure 4:
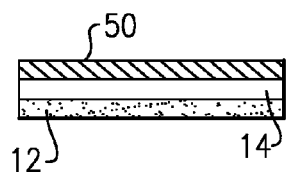
FIG. 4 illustrates an example implementation of a bonding step of the method.
Figure 5:
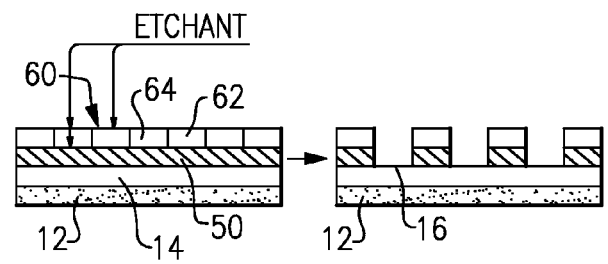
FIG. 5 illustrates an example implementation of a removal step of the method.
Figure 6:
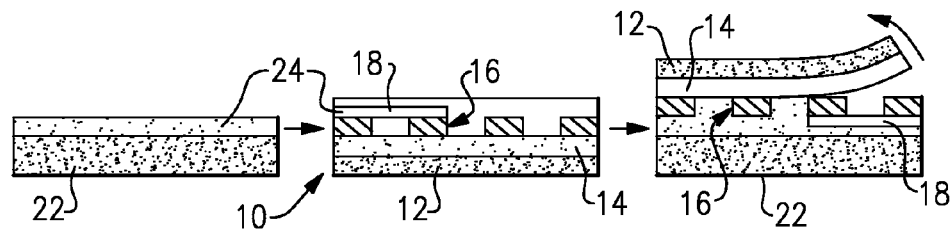
FIG. 6 illustrates an example implementation of a transferring step of the method.

FIGS. 4-6 schematically illustrate an example implementation of the respective bonding action 42, removal action 44, and transfer action 46 of the disclosed method 40. In FIG. 4, an adhesive for the adhesive layer 14 is applied to the donor film 12, the electrically conductive layer 50, or both to bond the electrically conductive layer 50 to the donor film 12. For instance, the electrically conductive layer 50 may be a metal layer, such as copper foil. The electrically conductive layer 50 may correspond in shape and size to the shape and size of the donor film 12 such that the electrically conductive layer 50 completely covers one side of the donor film 12.

FIG. 5 schematically illustrates an example removal action 44 for removing selected portions of the electrically conductive layer 50 from the donor film 12 to provide the circuit arrangement 16. In this example, an etch-resistant mask 60 is bonded to the electrically conductive layer 50. The etch-resistant mask 60 includes etch-resistant regions 62 at locations corresponding to the desired circuit arrangement 16, and open or non-etch resistant regions 64 at locations corresponding to regions of the electrically conductive layer 50 that are to be removed.

A chemical etchant, such as an acidic solution, is then applied to the mask 60. The etch-resistant regions 62 of the mask 60 prevent removal of the portions of the electrically conductive layer 50 that are directly underneath the solid portions 62, and the open or non-etch resistant regions 64 of the mask 60 allow removal of the portions of the electrically conductive layer 50 that are directly underneath the non-etch resistant regions 64. Thus, the pattern of the etch-resistant regions 62 and the non-etch resistant regions 64 corresponds to the design of the circuit arrangement 16 (e.g., an etched-metal circuit).

The electrical devices 18 may be incorporated into the transfer film 10 after the removal action 44 stage. For instance, after etching and subsequent removal of the mask 60, one or more of the electrical devices 18 may be secured to the donor film 12 using the solder 19. Alternatively, the electrical devices 18 may be secured to the circuit arrangement 16 after transfer of the circuit arrangement 16 to the substrate 22.

FIG. 6 schematically illustrates an example of the transfer action 46. In this example, the adhesive layer 24 is applied to the substrate 22, the transfer film 10, or both. The adhesive layer 24 may be an epoxy adhesive or other type of adhesive that is stronger than the adhesive used for the adhesive layer 14 used to bond the circuit arrangement 16 to the donor film 12.

The transfer film 10 is then placed onto the substrate 22, with the circuit arrangement 16 being between the substrate 22 and the donor film 12. After the adhesive layer 24 cures, the donor film 12 and adhesive layer 14 may be peeled from the circuit arrangement 16, leaving the circuit arrangement 16 securely bonded to the substrate 22. As can be appreciated, the bonding strength of the adhesive layer 24 should be stronger than the bonding strength of the adhesive layer 14, or the circuit arrangement 16 may be peeled away from the substrate 22 when the donor film 12 is removed. In this regard, the circuit arrangement 16 is only temporarily bonded to the donor film 12.

The disclosed example transfer film 10 and method 40 may be used for incorporating the circuit arrangement 16 onto the substrate 22 with minimal invasiveness. For instance, the substrate 22 structurally supports the circuit arrangement 16 and there is no need for incorporating traditional printed circuit boards having substrates of their own that may cause mechanical weakness in a substrate. Moreover, the transfer film 10 and method 40 may be used to apply the circuit arrangement 16 onto many different type of surfaces, such as flat or contoured surfaces.

Although a combination of features is shown in the illustrated examples, not all of them need to be combined to realize the benefits of various embodiments of this disclosure. In other words, a system designed according to an embodiment of this disclosure will not necessarily include all of the features shown in any one of the Figures or all of the portions schematically shown in the Figures. Moreover, selected features of one example embodiment may be combined with selected features of other example embodiments.

The preceding description is exemplary rather than limiting in nature. Variations and modifications to the disclosed examples may become apparent to those skilled in the art that do not necessarily depart from the essence of this disclosure. The scope of legal protection given to this disclosure can only be determined by studying the following claims.

What is claimed is:

1. A method of fabricating a circuit, comprising:
   bonding an electrically conductive layer to a carrier film using a silicone polymer adhesive;
   removing selected portions of the electrically conductive layer from the carrier film to provide a circuit arrangement; and
   transferring the circuit arrangement from the carrier film to a substrate.

2. The method as recited in claim 1, wherein the bonding of the electrically conductive layer to the carrier film includes bonding a metal foil to the carrier film.

3. The method as recited in claim 1, wherein the bonding of the electrically conductive layer to the carrier film includes applying the silicone polymer adhesive on the carrier film.

4. The method as recited in claim 1, wherein the removing of the selected portions of the electrically conductive layer includes chemically etching the selected portions.

5. The method as recited in claim 1, wherein the removing of the selected portions of the electrically conductive layer includes applying an etch-resistant mask onto selected regions of the electrically conductive layer that correspond to the circuit arrangement.

6. The method as recited in claim 1, wherein the transferring of the circuit arrangement includes removing the carrier film from the circuit arrangement.

7. The method as recited in claim 1, wherein the transferring of the circuit arrangement includes non-removably bonding the circuit arrangement to the substrate.

8. The method as recited in claim 1, further comprising bonding at least one electrical device to the carrier film.

9. The method as recited in claim 1, wherein the carrier film is flexible.

10. The method as recited in claim 1, wherein the carrier film is polyimide.

11. The method as recited in claim 1, wherein the carrier film has a three-dimensional contour.

12. The method as recited in claim 1, wherein the transferring of the circuit arrangement includes non-removably bonding the circuit arrangement to the substrate using another adhesive that is stronger than the adhesive used to bond the electrically conductive layer to the carrier film.

13. The method as recited in claim 1, wherein the substrate is a carbon fiber composite material.

14. The method as recited in claim 1, wherein the substrate is an airfoil.

15. A method of fabricating a circuit, comprising:
   bonding a metal layer to a carrier film;
   etching selected portions of the metal layer to provide a circuit arrangement;
   bonding at least one electrical device to the circuit arrangement; and
   transferring the circuit arrangement and the at least one electrical device from the carrier film to a substrate.

16. The method as recited in claim 15, wherein the bonding of the at least one electrical device to the carrier film includes applying solder to the circuit arrangement.

17. A method of fabricating a circuit, comprising:
   providing a transfer film having a circuit arrangement removeably bonded to a carrier film by an adhesive; and
   transferring the circuit arrangement from the carrier film to an airfoil.

18. The method as recited in claim 17, wherein the airfoil is a carbon fiber composite material and the adhesive is selected from the group consisting of acrylic polymer and silicone polymer.

\* \* \* \* \*